United States Patent [19]

Rhiger et al.

[11] Patent Number: 5,616,925
[45] Date of Patent: Apr. 1, 1997

[54] GAMMA RAY DETECTOR WITH IMPROVED RESOLUTION AND METHOD OF FABRICATION

[75] Inventors: David R. Rhiger; Sanghamitra Sen, both of Santa Barbara; William J. Hamilton, Jr., Ventura, all of Calif.

[73] Assignee: Santa Barbara Research Center, Goleta, Calif.

[21] Appl. No.: 486,497

[22] Filed: Jun. 7, 1995

[51] Int. Cl.$^6$ .......................... G01T 1/24; H01L 31/0256
[52] U.S. Cl. ......................... 250/370.13; 250/370.09; 250/370.12
[58] Field of Search ..................... 250/370.13, 370.09, 250/370.12, 370.14

[56] References Cited

U.S. PATENT DOCUMENTS 5,391,882  2/1995  Rhiger ........................... 250/370.13

OTHER PUBLICATIONS

Sen, S., et al. "Crystal Growth of Large–Area Single–Crystal CdTe and CdZnTe", *Journal of Crystal Growth* 86 (1988), North–Holland, Amsterdam, pp. 111–117.

Grove, A.S., *Physics and Technology of Semiconductor Devices*, John Wiley & Sons, New York, 1967, p. 46.

Hogg, J.H.C., et al., "Chemical Diffusion of Hg in CdTe", *Materials Science and Engineering*, B16 (1993), pp. 195–198.

Jones, E. D., et al., "The diffusion of mercury in cadmium telluride", *Journal of Crystal Growth* 118, (1992), pp. 1–13.

Siffert, P., "Cadmium Telluride Detectors and Applications", *Material Resources Society Symposium*, vol. 16 (1983), pp. 87–114.

*Primary Examiner*—Constantine Hannaher
*Assistant Examiner*—Virgil Orlando Tyler
*Attorney, Agent, or Firm*—W. C. Schubert; W. K. Denson-Low

[57] ABSTRACT

Gamma ray detectors (20, 130) are provided with a detector layer (30) that is formed of $Hg_xCd_{1-x-y}Zn_yTe$, wherein $0<x<0.05$ and $0 \leq y<0.5$. The Hg percentage in the group II sublattice of this detector layer is limited to replace Cd vacancies. These Cd vacancies are native point defects which degrade the resolution of gamma ray detectors because they facilitate early electron-hole recombination and time delays of current carriers.

25 Claims, 3 Drawing Sheets

5,616,925

GAMMA RAY DETECTOR WITH IMPROVED RESOLUTION AND METHOD OF FABRICATION

BACKGROUND OF THE INVENTION

1. Field of the Invention

The present invention relates generally to gamma ray detection and more particularly to semiconductor gamma ray detectors.

2. Description of the Related Art

Gamma rays have wavelengths which are shorter than $10^{-10}$ meters and energies ($E\gamma$) which are inversely proportional to their wavelengths. When they interact with a semiconductor that has an energy bandgap Eg, approximately $E\gamma/3Eg$ electron-hole pairs are generated (the number 3 in this equation is an efficiency factor). For example, the bandgap energy of cadmium telluride (CdTe) is approximately 1.5 eV. Thus, a gamma ray with $E\gamma=150 keV$ will generate $150 \times 10^3/4.5 = 33.3 \times 10^3$ electron-hole pairs.

CdTe and cadmium zinc telluride (CdZnTe) have proven to be particularly useful in the art of gamma ray detection. Each of these compound semiconductors has a wide energy bandgap and can be grown by processes, e.g., traveling heater method (THM) and the Bridgman method, which yield high-resistivity crystals (for further growth details, see Sen, S., et al. "Crystal Growth of Large-Area Single-Crystal CdTe and CdZnTe", *Journal of Crystal Growth* 86, 1988, North-Holland, Amsterdam, pp. 111–117). These two parameters, wide bandgap and high resistivity, inhibit noise-producing leakage currents. In addition, because Cd and Te have relatively high atomic numbers (48 and 50), they present a large number of electrons for interaction with incident gamma rays. This enhances electron-hole generation and facilitates the production of detectable current signals. Finally, the production technology of these semiconductors has matured to the point that products designed to include them are commercially viable. Zn is typically added to CdTe to further widen the bandgap. However, the percentage of Zn is usually limited because of its low atomic number.

CdTe and CdZnTe are respectively binary and ternary compound semiconductors that are formed from elements of the II and VI columns of the periodic table. Accordingly, they are typically referred to as II–VI semiconductors. A ternary semiconductor is sometimes called an alloy semiconductor because one sublattice of the semiconductor crystal is shared in an alloy composition. The alloy composition of CdZnTe is typically written as $Cd_{1-x}Zn_xTe$ which means that Zn atoms and Cd atoms are randomly mixed in the crystal's group II sublattice in the ratio of x and 1−x mole fractions. In this composition, all sites on the group VI sublattice are occupied by Te atoms.

This style of nomenclature can be easily extended to quaternary compounds. For example, $In_xGa_{1-x-y}Al_yAs$ describes a III–V compound in which In atoms, Ga atoms and Al atoms are randomly mixed in the crystal's group III sublattice in the ratio of x, y and 1−x−y mole fractions. It is customary to allocate the x or y designation to the element or elements that have a minority alloy percentage.

Detectors built with CdTe and CdZnTe are used to form gamma ray counters and gamma ray spectrometers. A gamma ray counter provides a simple count of incident gamma rays. In addition, a gamma ray spectrometer distinguishes between energy levels of incident gamma rays so that the population of gamma rays at each incident energy level (or each incident wavelength) is determined. Gamma ray spectrometers are used in a variety of technical fields, e.g., nuclear medicine, nuclear fuel characterization, satellite astronomy and chemical analysis in oil well bores. For further background discussion of CdTe detectors and for models of energy levels that are associated with crystal defects, see Siffert, P., "Cadmium Telluride Detectors and Applications", *Material Resource Symposium Proceedings*, Vol. 16, 1983, pp. 87–114).

In a gamma ray spectrometer, an electrical bias is typically applied to sweep charge carriers (electrons and holes) from the detector to form a detectable current pulse. The amplitude of the pulse is proportional to the number of generated electron-hole pairs (i.e., inversely proportional to the radiation wavelength) and the duration of the pulse is a function of the electron and hole collection times.

In practice, a number of factors decrease the amplitude and increase the time duration of the detected pulses. These factors cause a spectrometer's ability to distinguish between gamma ray wavelengths (i.e., its resolution) to be degraded. Among the most important factors are native and foreign defects in the semiconductor crystal of the gamma ray detector.

Accordingly, methods have been developed for reducing the number of foreign defects, i.e., impurity content, in CdTe and CdZnTe. One approach is to reduce impurities in the starting materials of elemental Cd and Te, e.g., by the processes of distillation and zone refining. Another approach is to reduce the impurity content of grown CdTe and CdZnTe crystals, e.g., by surface damage gettering. CdTe wafers have also been annealed in the presence of Cd vapor with the objective of improving the crystalline quality by adjusting the crystal stoichiometry and reducing Te precipitates.

Methods for reducing gross and point native defects have generally centered on the control of crystal growth conditions. For example, temperature, temperature ramp rates, vapor overpressure and growth direction can be carefully manipulated to limit gross crystal defects, e.g., grain boundaries and twin boundaries. Typically, a lower priority has been placed on the reduction of native point defects, e.g., vacancies (a missing atom at a crystal lattice site) and interstitials (an atom positioned between lattice sites).

SUMMARY OF THE INVENTION

The present invention is directed to gamma ray detectors that exhibit improved resolution and to methods of making the detectors. The resolution improvement is achieved by a recognition that native point defects in CdTe and CdZnTe semiconductors, e.g., Cd vacancies, degrade the gamma ray resolution of these semiconductors because they provide centers for early hole-electron recombination and for time delay of holes and electrons. The improvement is achieved by a further recognition that Cd vacancies can be reduced with the introduction of Hg atoms into the group II sublattice of CdTe and CdZnTe in limited alloy percentages, e.g., <5%.

The fabrication method used by the invention introduces a plurality of Hg atoms into a CdTe or CdZnTe semiconductor, with at least some of the Hg atoms occupying different Cd vacancies to create a $Hg_xCd_{1-x-y}Zn_yTe$ semiconductor crystal, wherein 0<x<0.05.

A detector embodiment includes first and second ohmic contacts respectively joined to first and second sides of a $Hg_xCd_{1-x-y}Zn_yTe$ detector layer, wherein 0<x<0.05.

Another detector embodiment includes a p-doped semiconductor layer of $Hg_{1-z}Cd_zTe$ and an n-doped semiconductor layer of $Hg_{1-z}Cd_zTe$ that are arranged to form first and second heterojunctions with a $Hg_xCd_{1-x-y}Zn_yTe$ detector layer, wherein 0<x<0.05.

The novel features of the invention are set forth with particularity in the appended claims. The invention will be

DETAILED DESCRIPTION OF THE INVENTION

Figure 1:
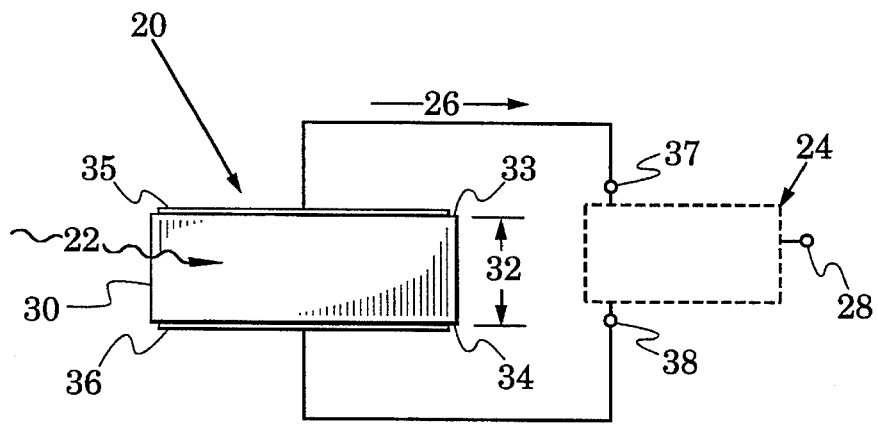
FIG. 1 is a diagram of a gamma ray detector in accordance with the present invention; the detector is shown in association with a current detection circuit.

FIG. 1 illustrates a gamma ray detector 20 in accordance with the present invention. Incident gamma ray radiation 22 generates current carriers in the detector 20 and, under the influence of an electrical bias of an associated detection circuit 24, these carriers form a current 26. In response to this current, the detection circuit 24 generates corresponding pulse signals at its output terminal 28.

The detector 20 has a semiconductor detector layer 30 that is formed of a II–VI quaternary semiconductor $Hg_xCd_{1-x-y}Zn_yTe$, wherein $0<x<0.05$ and $0 \leq y<0.5$. The detector layer 30 has a thickness 32 between opposed sides 33, 34. Deposited (e.g., by evaporation or by sputtering) on each of these sides are respective ohmic contacts 35 and 36. Suitable materials for the ohmic contacts 35 and 36 include gold (Au) and platinum (Pt). In FIG. 1, the ohmic contacts 35 and 36 are respectively connected to the input terminals 37, 38 of the detection circuit 24.

For efficient gamma ray detection, the layer 30 is preferably intrinsic. Its thickness 32 is selected in accordance with the intended detector application. Although thinner detector layers are easier to fabricate, they will not stop as many high-energy gamma rays as will a thicker layer. On the other hand, increasing the thickness 32 will increase the electron and hole collection times, which increases the detector's response time and will also increase the chance of carrier trapping, which lowers the detector's pulse height. These considerations generally lead to a preferred thickness 32 that is in the range of 0.5–10 millimeters.

Figure 2:
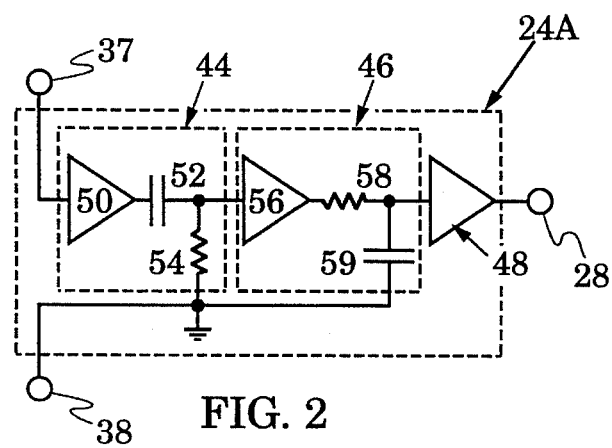
FIG. 2 is an exemplary schematic for the current detection circuit of FIG. 1.

In the operation of the detector of FIG. 1, each incident gamma ray in the radiation 22 will cause a pulse at the output terminal 28. The shape of each pulse is principally determined by the structure of the detector 20 and by the circuitry of the detection circuit 24. To illustrate the improved resolution of the detector 20, the exemplary detection circuit 24A of FIG. 2 will be employed. The circuit 24A includes a differentiator 44, an integrator 46 and an output amplifier 48 which are connected in series between the input terminals 37, 38 and the output terminal 28. The differentiator 44 consists of a series amplifier 50 and capacitor 52 and a shunt resistor 54. The integrator 46 consists of a series amplifier 56 and resistor 58 and a shunt capacitor 59. The shunt elements are connected to a circuit ground which is also connected to the ground input terminal 38.

Figure 3:
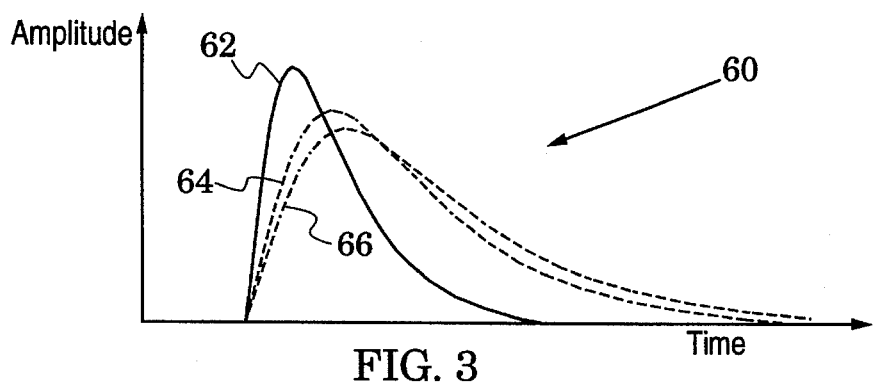
FIG. 3 is a diagram of detected gamma ray pulses at the output of the exemplary detection circuit of FIG. 2, comparing a pulse shape that originated in the detector of FIG. 1 with pulse shapes that originated in prior art detectors.

The graph 60 of FIG. 3 illustrates a single pulse 62 as it appears at the output terminal 28 of the detection circuit 24A. The pulse 62 is originated by the gamma ray detector 20. In comparison, the pulses 64 and 66 (shown by broken lines) are typical pulses from the detection circuit 24A when CdTe or CdZnTe is substituted for the detector layer 30 in the detector 20. Because these latter semiconductors have more native point defects, their pulse amplitude is lowered and the pulse duration is extended. The extent of this pulse degradation varies with the portion of the semiconductor that is associated with the incident gamma ray. This is indicated by the different amplitude and duration of the pulses 64, 66.

In a gamma ray spectrometer, a large number of received pulses are processed and a pulse height spectrum is generated which plots the number of received pulses at each pulse height. Because the height of each pulse is a function of the wavelength of the gamma ray that produced it, the pulse height spectrum resolves the wavelength and intensity of the incident gamma ray radiation. A plurality of pulses that have the shape of the pulse 62 in FIG. 3 will generate a spectral line 72 as shown in the pulse height spectrum 70 of FIG. 4. In comparison, the degraded pulses 64, 66 of FIG. 3 will generate a spectral line 74 (shown by a broken line). The structure of the detector 20 significantly improves the resolution of the pulse height spectrum.

Figure 4:
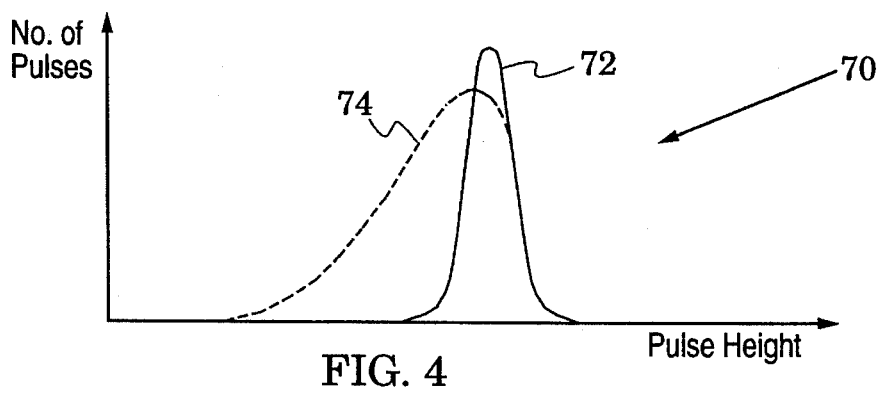
FIG. 4 is a diagram of pulse height spectra at the output of the exemplary detection circuit of FIG. 2, comparing a spectrum that originated in the detector of FIG. 1 with a spectrum that originated in prior art detectors.

Attention is now directed to the detailed structure of the gamma ray detector 20 that facilitates the improved spectrometer performance shown in FIG. 4 and, in particular, to the crystal structure of the detector layer 30 of FIG. 1. In a perfect semiconductor crystal, all the atoms would be arranged at uniformly positioned atomic sites. In a real crystal, however, various crystal defects occur. These include line defects or dislocations, e.g., edge and screw dislocations, and plane defects, e.g., grain boundaries and stacking faults.

Figure 5:
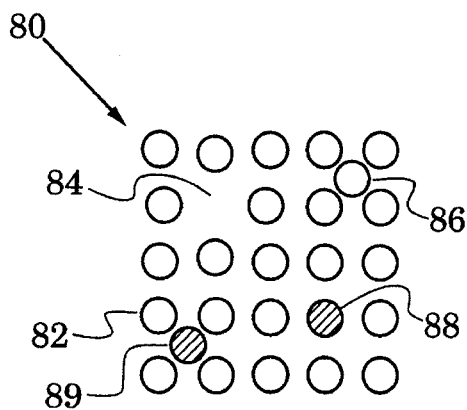
FIG. 5 is a sublattice diagram of a CdTe semiconductor in a typical gamma ray detector.

Of more pertinence to the present invention, crystal defects also include point defects as illustrated in FIG. 5, which shows the group II sublattice 80 of a typical CdTe semiconductor. The arrangement of Cd atoms 82 in the sublattice 80 includes a Cd vacancy 84 and a cadmium atom 86 in an interstitial site. Other point defects in the sublattice 80 are illustrated as an impurity atom 88 that occupies a normal atomic site (a substitutional impurity) and an impurity atom 89 that is in an interstitial atomic site (an interstitial impurity). The cadmium vacancy 84 and the interstitial cadmium atom 86 are typically referred to as "native point defects", as opposed to the substitutional impurity 88 and the interstitial impurity 89 which are typically referred to as "foreign point defects". When native point defects and foreign point defects occur in close proximity, they are said to be "complexed".

Figure 6:
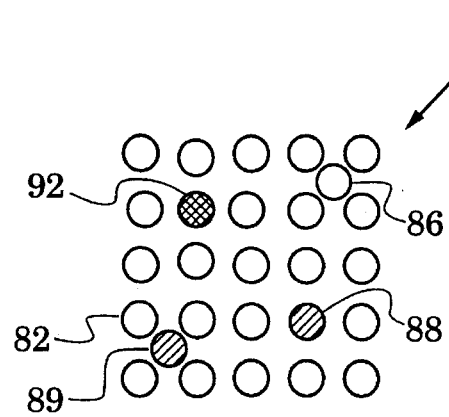
FIG. 6 is a sublattice diagram of a CdZnTe semiconductor in the gamma ray detector of FIG. 1.

In contrast, FIG. 6 illustrates the group II sublattice 90 in the $Hg_xCd_{1-x-y}Zn_yTe$ detector layer 30 of FIG. 1. The sublattice 90 is similar to the sublattice 80, with like elements indicated by like reference numbers. However, the sublattice 90 has the Cd vacancy 84 of FIG. 5 filled by a mercury (Hg) atom 92. The significance of this point defect reduction can be described by consideration of the point defect energy levels that are shown in the exemplary energy level model 100 of FIG. 7 (for further discussion of the model, see Siffert, op. cit.).

The model 100 indicates that each native point defect in FIG. 5 has an associated energy level that lies within the energy gap Eg between the valence and conduction bands of the semiconductor crystal. The energy levels 102 and 104 respectively correspond with a cadmium vacancy that has trapped a single electron ($V^-_{Cd}$) and a cadmium vacancy that has trapped two electrons ($V^{--}_{Cd}$). The energy levels 106 and 108 correspond with complexes of cadmium vacancies and impurity atoms. In particular, the energy level 106 is associated with a cadmium vacancy which has trapped two electrons and an impurity atom of species X which has lost an electron. The energy level 108 is associated is associated with a cadmium vacancy which has trapped two electrons and two impurity atoms of species X which have each lost an electron. (Various crystal lattice models have been produced to define the energy levels of native and foreign point defects, e.g., see Siffert, op. cit.)

Figure 7:
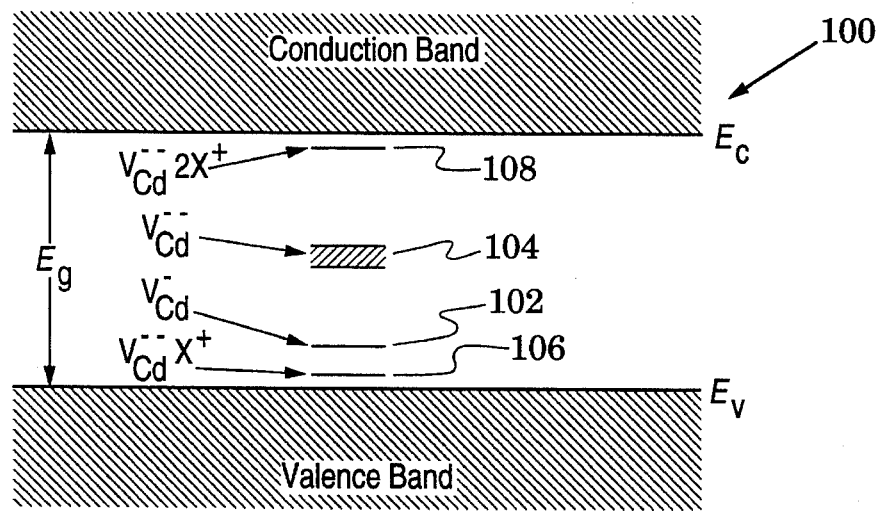
FIG. 7 is a diagram of the energy bands and point defect energy levels in a typical CdTe semiconductor.
Figure 8:
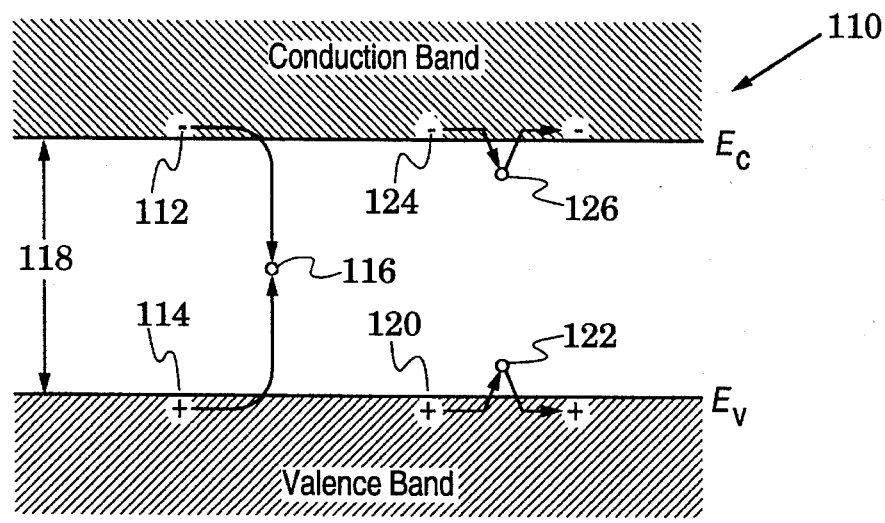
FIG. 8 is a diagram which illustrates electron-hole recombination and delay that result from the native point defects illustrated in FIG. 7.

The energy levels of FIG. 7 are often referred to as recombination or trapping centers, or simply as "traps", because of their effect on current carriers. As shown in FIG. 8, the electrons and holes that are generated by incident gamma rays typically have energies that are respectively just above the conduction band edge energy Ec and just below the valence band edge energy Ev. In one form of recombination, an electron 112 and a hole 114 recombine at a trap 116 whose energy level is deep within the bandgap 118, e.g., the trap 104 of FIG. 7.

Alternatively, a hole 120 can drop into a trap 122 that is close to the valence band edge energy Ev, e.g., the trap 102 of FIG. 7. After some time delay, this hole can return to the valence band where it is available for recombination or collection at a later time. In a similar manner, an electron 124 can be time delayed in a trap 126 that is near the conduction band edge energy Ec, e.g., the trap 108 of FIG. 7. The excess energy of carriers that recombine in traps in the bandgap 118 is generallly carried away by phonons in a nonradiative process, i.e., as heat that is absorbed by the crystal lattice. In general, native and foreign point defects give rise to energy levels which can act as a recombination centers or as time-delaying stations for current carriers.

Recombination processes, exemplified by the recombination at the trap 116 of FIG. 8, cause a reduction of detected pulse levels as shown in broken lines in FIGS. 3 and 4. Temporary trapping of carriers, exemplified by the hole capture in the trap 122 of FIG. 8, causes a widening of detected pulses as also shown in broken lines in FIGS. 3 and 4. The amount of height reduction and time extension depend upon where each gamma ray strikes the detector layer 30, i.e., they depend upon how many trapping centers are involved. These pulse degrading processes are reduced in the detector 20 of FIG. 1 because, as shown in its sublattice 90 of FIG. 6, the number of Cd vacancies has been reduced by substitutional Hg atoms. Each Hg atom that fills a Cd vacancy effectively removes that trapping site from the crystal sublattice. Hg atoms are particularly suited for this substitution because of their high lattice mobility.

In practicing the present invention, one process of introducing Hg into CdTe or CdZnTe is to anneal a wafer in Hg vapor at a temperature substantially in the range of 300–600° C. for a time that is substantially in the range of 1–90 days. A temperature-time combination can be selected from this range to cause Hg to occupy a small alloy percentage of the group II lattice sites. Because this process is intended primarily for filling Cd vacancies, the percentage should be limited to 5%, with a more preferred limit of 1%. This will result in a significant reduction of the wafer's native point defects while having a negligible effect upon the bandgap. A CdTe or CdZnTe film, e.g., 30 microns or less, requires a shorter annealing time, e.g., 1–24 hours.

Another process that is particularly suited for introducing Hg into a film (or a thin near-surface zone of a thick substrate) is to first epitaxially grow a HgCdTe layer onto the film. When this heterostructure is annealed, the Hg is supplied by the HgCdTe layer. Afterwards, the HgCdTe layer can be removed or, alternatively, left in place as a contact layer, e.g., the layers 132 and 134 of FIG. 9.

The invention may also be practiced by adding Hg atoms as the detector material is grown. Elemental Hg or a compound such as HgTe can be placed in proximity to the semiconductor crystal during its growth.

An exemplary annealing process for introducing Hg into a CdTe wafer would proceed at a temperature of 550° C. At this temperature, the fast diffusion coefficient D for Hg in CdTe is $3.9\times10^{-11}$ cm$^2$/sec (Jones, E. D., et al., "The diffusion of mercury in cadmium telluride", Journal of Crystal Growth 118, 1992, pp. 1–13). With a diffusion time of 30 days, the characteristic diffusion length $=2(Dt)^{1/2}=200$ microns (Grove, A.S., *Physics and Technology of Semiconductor Devices*, John Wiley & Sons, New York, 1967, p. 46). The characteristic length is that length in which the Hg concentration profile in the CdTe would fall to 16% of its surface value (assuming it obeys a complementary error function). The profile tail extends much deeper than the characteristic length. Because only trace amounts of Hg are necessary for a reduction of native point defects, the Hg can effectively reach defect sites throughout a much thicker layer. The process time can be reduced by arranging the diffusion to reach opposing sides of the wafer.

Figure 9:
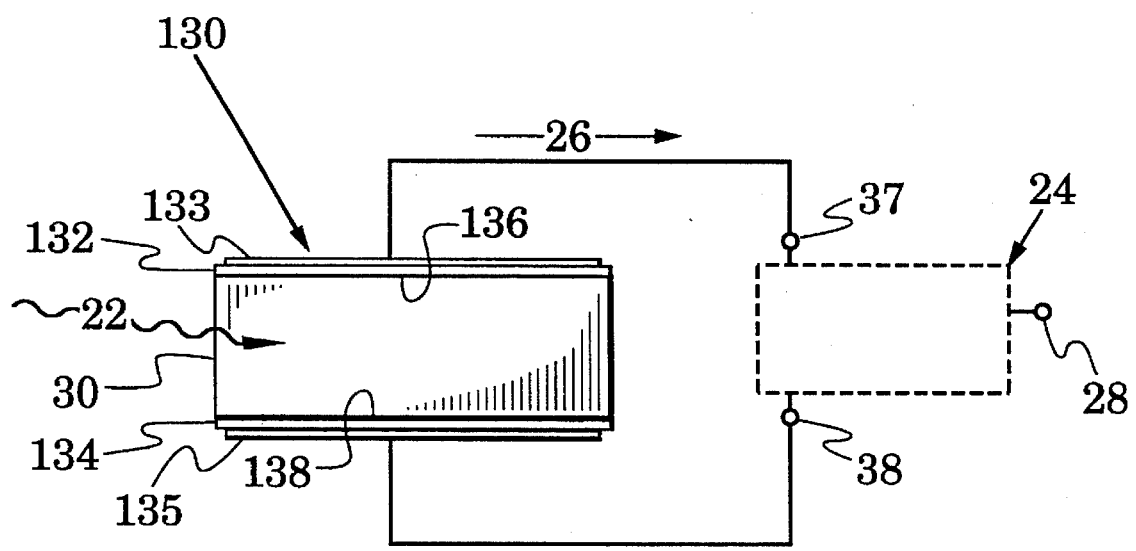
FIG. 9 is a diagram of another gamma ray detector in accordance with the present invention; the detector is shown in association with a current detection circuit.

Another gamma ray detector 130 in accordance with the present invention is shown in FIG. 9. The detector 130 is also shown in association with the detection circuit 24. The detector 130 is similar to the detector 20 of FIG. 1, with like elements indicated by like reference numbers. However, the detector 130 includes a p-type HgCdTe semiconductor layer 132 between the detector layer 30 and an ohmic contact 133 and an n-type HgCdTe semiconductor layer 134 between the detector layer 30 and an ohmic contact 135. Thus, heterojunctions 136 and 138 are formed on the opposite faces of the detector layer 30. The layers 132, 134 have a thickness that is substantially in the range of 1–50 microns. This p-i-n structure is substantially taught in U.S. Patent No. 5,391,882, which was issued Feb. 21, 1995 in the name of David R. Rhiger and assigned to Santa Barbara Research Center, the assignee of the present invention.

Each of the layers 132, 134 have the alloy composition $Hg_{1-x}Cd_xTe$. The composition of each layer 132, 134 is preferably graded so that $0.6 \leq x \leq 1.0$ at its respective heterojunction, $0 \leq x \leq 0.4$ at the interface with its respective ohmic contact and x monotonically decreases between the heterojunction and the interface. This grading causes the bandgap of each the layers 132, 134 to increase from its interface with its respective ohmic contact to its respective heterojunction. The large bandgap at the heterojunction inhibits the injection of minority carriers into the detection layer 30, with a consequent reduction in noise signals. The smaller bandgap at the ohmic contact reduces the ohmic resistance to majority carrier flow between each ohmic contact and its adjoining semiconductor layer.

The semiconductor layer 132 is doped with an acceptor, e.g., arsenic (As), and the semiconductor layer 134 is doped with a donor, e.g., indium (In). The ohmic contacts 133 and 135 are chosen for compatibility with the p-type and n-type layers 132 and 134. For example, the ohmic contact 133 can be Au and the ohmic contact 135 can be palladium (Pd).

Preferably, the layers 132, 134 and 30 are annealed, e.g., in a Hg atmosphere at 400°–450° C. for a time that is substantially in the range of 0.5–4 hours, to diffuse Cd and Hg across the heterojunctions 136, 138 without causing significant movement of the dopant ions. This diffusion increases the potential barriers to minority carriers at the heterojunctions 136, 138.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A gamma ray detector, comprising:
   a semiconductor detector layer having first and second sides and formed of $Hg_xCd_{1-x-y}Zn_yTe$, wherein $0<x<0.05$ and $0\leq y<0.5$; and
   first and second ohmic contacts respectively contacting said first and second sides.

2. The gamma ray detector of claim 1, wherein $0<x<0.01$.

3. The gamma ray detector of claim 1, wherein said ohmic contacts include an Au layer.

4. The gamma ray detector of claim 1, wherein said ohmic contacts include a Pt layer.

5. The gamma ray detector of claim 1, wherein said detector layer has a thickness between said first and second sides that is substantially in the range of 0.5–10 millimeters.

6. A gamma ray detector, comprising:
   a semiconductor detector layer formed of $Hg_xCd_{1-x-y}Zn_yTe$, wherein $0<x<0.05$ and $0\leq y<0.5$;
   a p-doped semiconductor layer formed of $Hg_{1-z}Cd_zTe$ and joined with said detector layer to form a first heterojunction, wherein $0<z<1$;
   an n-doped semiconductor layer formed of $Hg_{1-z}Cd_zTe$ and joined with said detector layer to form a second heterojunction, wherein $0<z<1$;
   a first ohmic contact contacting said p-doped layer; and
   a second ohmic contact contacting said n-doped layer.

7. The gamma ray detector of claim 6, wherein $0<x<0.01$.

8. The gamma ray detector of claim 6, wherein;
   $0.6<z<1$ where said p-doped layer adjoins said first heterojunction, $0<z<0.4$ where said p-doped layer contacts said first ohmic contact and z monotonically decreases between said first heterojunction and said first ohmic contact; and
   $0.6<z<1$ where said n-doped layer adjoins said second heterojunction, $0<z<0.4$ where said n-doped layer contacts said second ohmic contact and z monotonically decreases between said second heterojunction and said second ohmic contact.

9. The gamma ray detector of claim 6, wherein said first ohmic contact includes an Au layer.

10. The gamma ray detector of claim 6, wherein said second ohmic contact includes a Pd layer.

11. The gamma ray detector of claim 6, wherein said detector layer has a thickness between said first and second heterojunctions that is substantially in the range of 0.5–10 millimeters.

12. The gamma ray detector of claim 6, wherein said p-doped semiconductor includes an As dopant.

13. The gamma ray detector of claim 6, wherein said n-doped semiconductor includes an In dopant.

14. A method of detecting gamma rays, comprising the steps of:

providing a $Hg_xCd_{1-x-y}Zn_yTe$ semiconductor crystal, wherein $0<x<0.05$ and $0\leq y<0.5$;

positioning said $Hg_xCd_{1-x-y}Zn_yTe$ semiconductor crystal to intercept said gamma rays; and detecting the presence of electron-hole pairs that are generated by the interaction of some of said gamma rays with some of the atoms of said crystal.

15. The method of claim 14, wherein $0<x<0.01$.

16. The method of claim 14, wherein said providing step includes the steps of:

obtaining a $Cd_{1-y}Zn_yTe$ semiconductor crystal, wherein $0\leq y<0.5$ and said crystal has a plurality of Cd vacancies; and introducing a plurality of Hg atoms into said crystal with at least some of said Hg atoms each occupying a different one of said Cd vacancies to create a $Hg_xCd_{1-x-y}Zn_yTe$ semiconductor crystal, wherein $0<x<0.05$ and $0\leq y<0.5$.

17. The method of claim 16, wherein said introducing step includes the step off annealing said $Cd_{1-y}Zn_yTe$ semiconductor crystal in the presence of a Hg source for a temperature and a time sufficient to convert it to said $Hg_xCd_{1-x-y}Zn_yTe$ semiconductor crystal.

18. The method of claim 17, wherein said Hg source comprises a liquid Hg.

19. The method of claim 17, wherein said Hg source comprises a HgTe compound.

20. The method of claim 16, wherein said introducing step includes the steps of:

growing a HgCdTe semiconductor layer on said $Cd_{1-y}Zn_yTe$ semiconductor crystal to form a heterostructure; and heating said heterostructure for a temperature and time combination sufficient to convert said $Cd_{1-y}Zn_yTe$ semiconductor crystal to said $Hg_xCd_{1-x-y}Zn_yTe$ semiconductor crystal.

21. The method of claim 20, wherein said introducing step further includes the step of removing said layer.

22. The method of claim 14, wherein said providing step includes the step of:

growing a CdZnTe semiconductor crystal in the presence of a Hg source to create a $Hg_xCd_{1-x-y}Zn_yTe$ semiconductor crystal, wherein $0<x<0.05$ and $0\leq y<0.5$.

23. The method of claim 22, wherein said Hg source comprises a liquid Hg.

24. The method of claim 22, wherein said Hg source comprises a HgTe compound.

25. The method of claim 14, further including the steps of:

growing a first HgCdTe semiconductor layer onto said $Hg_xCd_{1-x-y}Zn_yTe$ semiconductor crystal to form a first heterojunction; and growing a second HgCdTe semiconductor layer onto said $Hg_xCd_{1-x-y}Zn_yTe$ semiconductor crystal to form a second heterojunction.

* * * * *